(12) United States Patent
Hashemi et al.

(10) Patent No.: US 10,784,347 B1
(45) Date of Patent: Sep. 22, 2020

(54) HIGH-PERFORMANCE LATERAL BJT WITH EPITAXIAL LIGHTLY DOPED INTRINSIC BASE

(71) Applicant: International Business Machines Corporation, Armonk, NY (US)

(72) Inventors: Pouya Hashemi, Purchase, NY (US); Tak H. Ning, Yorktown Heights, NY (US); Jeng-Bang Yau, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/295,672

(22) Filed: Mar. 7, 2019

(51) Int. Cl.
*H01L 29/04* (2006.01)
*H01L 31/036* (2006.01)
*H01L 29/10* (2006.01)
*H01L 29/08* (2006.01)
*H01L 29/66* (2006.01)
*H01L 29/735* (2006.01)
*H01L 29/737* (2006.01)

(52) U.S. Cl.
CPC ...... *H01L 29/1008* (2013.01); *H01L 29/0808* (2013.01); *H01L 29/0821* (2013.01); *H01L 29/6625* (2013.01); *H01L 29/735* (2013.01); *H01L 29/737* (2013.01)

(58) Field of Classification Search
CPC ............. H01L 29/1008; H01L 29/0808; H01L 29/0821; H01L 29/735; H01L 29/737

USPC .......................................................... 257/49
See application file for complete search history.

(56) References Cited

U.S. PATENT DOCUMENTS

| | | | |
|---|---|---|---|
| 8,927,379 B2 | 1/2015 | Adkisson et al. | |
| 9,331,097 B2 | 5/2016 | Cai et al. | |
| 9,437,718 B1 | 9/2016 | Cai et al. | |
| 9,450,381 B1 * | 9/2016 | Cai | H01L 29/78654 |
| 9,502,504 B2 | 11/2016 | Cai et al. | |
| 9,812,370 B2 | 11/2017 | Chang et al. | |
| 2016/0064484 A1 * | 3/2016 | Harame | H01L 29/0821 |
| | | | 257/163 |

OTHER PUBLICATIONS

U.S. Appl. No. 15/979,649 entitled, "Single Crystalline Extrinsic Bases for Bipolar Junction Structures", filed on May 15, 2018, 37 pages, Inventors: Hashemi et al.

(Continued)

*Primary Examiner* — David S Blum
(74) *Attorney, Agent, or Firm* — Scully, Scott, Murphy & Presser, P.C.; Erik Johnson

(57) ABSTRACT

High-performance lateral bipolar junction transistors (BJTs) are provided in which a lightly doped upper intrinsic base region is formed between a lower intrinsic base region and an extrinsic base region. The lightly doped upper intrinsic base region provides two electron paths which contribute to the collector current, $I_C$. The presence of the lightly doped upper intrinsic base region increases the total $I_C$ and leads to higher current gain, $\beta$, if there is no increase of the base current, $I_B$.

15 Claims, 9 Drawing Sheets

(56) References Cited

OTHER PUBLICATIONS

Cai, J., et al., "Complementary Thin-Base Symmetric Lateral Bipolar Transistors on SOI", International Electron Devices Meeting (IEDM), Date of Conference: Dec. 5-7, 2011, 4 pages, 16.3.

Ning, T. H., et al., "On the Performance and Scaling of Symmetric Lateral Bipolar Transistors on SOI", IEEE Journal of the Electron Devices Society, Jan. 2013, pp. 21-27, vol. 1, No. 1.

Ning, T. H., et al., "A Perspective on SOI Symmetric Lateral Bipolar Transistors for Ultra-Low-Power Systems", IEEE Journal of the Electron Devices Society, Date of publication Apr. 7, 2016, pp. 227-235, vol. 4, No. 5.

Hashemi, P., et al., "Demonstration of Symmetric Lateral NPN Transistors on SOI Featuring Epitaxially Grown Emitter/Collector Regions," IEEE Journal of the Electron Devices Society, May 7, 2018, pp. 537-542, vol. 6.

Hashemi, P., et al., "First Demonstration of Symmetric Lateral NPN Transistors on SOI Featuring Epitaxially-Grown Emitter/Collector Regions", 2017 IEEE SOI-3D-Subthreshold Microelectronics Technology Unified Conference (S3S), Date of Conference:Oct. 16-19, 2017, 2 pages.

\* cited by examiner

US 10,784,347 B1

HIGH-PERFORMANCE LATERAL BJT WITH EPITAXIAL LIGHTLY DOPED INTRINSIC BASE

BACKGROUND

The present application relates to a semiconductor structure and a method of forming the same. More particularly, the present application relates to a lateral bipolar junction transistor (BJT) having increased collector current drive and current gain.

A bipolar junction transistor (BJT) is a semiconductor device containing an emitter region, a base region and a collector region having two P-N junctions with one of the P-N junctions being located between the emitter region and the base region, and the other P-N junction being located between the collector region and the base region. Each BJT can thus be classified as either PNP or NPN according to the arrangement of the p-type semiconductor material and the n-type semiconductor material. An NPN BJT has an n-type emitter region, a p-type base region, and an n-type collector region. A PNP BJT has a p-type emitter region, an n-type base region, and a p-type collector region. The function of a BJT is to amplify current, i.e., the collector current output (output signal) is larger than the base current (input signal).

One type of BJT is a lateral BJT. In a lateral BJT, the base region is located between the emitter region and collector region, with the emitter/base junction and the collector/base junction being formed between laterally arranged components. Lateral BJTs have drawn significant attention over the past decade due to their ease of processing and compatibility with mainstream complementary metal oxide semiconductors (CMOS). Lateral BJTs are suitable for digital as well as analog/mixed-signal applications. High-performance lateral BJTs that have increased collector current drive and current gain are needed to improve circuit speed.

SUMMARY

High-performance lateral bipolar junction transistors (BJTs) are provided in which a lightly doped upper intrinsic base region is formed between a lower intrinsic base region and an extrinsic base region. The lightly doped upper intrinsic base region provides two electron paths which contribute to the collector current, $I_C$. The presence of the lightly doped upper intrinsic base region increases the total $I_C$ and leads to higher current gain, $\beta$, if there is no increase of the base current, $I_B$.

In one aspect of the present application, a lateral BJT is provided. In one embodiment, the lateral BJT includes a lower intrinsic base region composed of a first semiconductor material of a first conductivity type that is located on a surface of a layer that is composed of at least a partially insulating material. An upper intrinsic base region composed of a second semiconductor material of the first conductivity type is located on the lower intrinsic base region. The upper intrinsic base region has a lower dopant concentration than the lower intrinsic base region. An extrinsic base region composed of a third semiconductor material of the first conductivity type is located on the upper intrinsic base region. The extrinsic base region has a higher dopant concentration than both the upper and lower intrinsic base regions. An emitter region composed of a fourth semiconductor material of a second conductivity type, opposite the first conductivity type, is located laterally adjacent to, and contacting, a first side of the lower intrinsic base region, and a collector region composed of the fourth semiconductor material of the second conductivity is located laterally adjacent to, and contacting, a second side of the lower intrinsic base region, which is opposite the first side of the lower intrinsic base region. In some embodiments, a permeable dielectric material is located between the extrinsic base region and the upper intrinsic base region.

In another aspect of the present application, a method of forming a lateral BJT is provided. In one embodiment, the method includes forming an upper intrinsic base layer composed of a second semiconductor material of a first conductivity type on a surface of a lower intrinsic base layer composed of a first semiconductor material of the first conductivity type, wherein the lower intrinsic base layer is present on a surface of a layer that is composed of at least a partially insulating material. A first patterned material stack is formed on a surface of the upper intrinsic base layer, wherein the first patterned material stack includes at least an extrinsic base region composed of a third semiconductor material of the first conductivity type. The upper intrinsic base layer is then patterned to provide a second patterned material stack utilizing the first patterned material stack as an etch mask, wherein the second patterned material stack includes at least a remaining portion of the upper intrinsic base layer which defines an upper intrinsic base region, and the extrinsic base region. Next, a dielectric spacer is formed along a sidewall of the second patterned material stack and in both an emitter-side and a collector-side of the second patterned material stack. A notch is created into the lower intrinsic base layer that is located on both the emitter-side and the collector-side to provide a faceted intrinsic base portion in both the emitter-side and the collector-side. Next, an emitter region composed of a fourth semiconductor material of a second conductivity type that is opposite the first conductivity type is formed in the emitter-side and a collector region composed of the fourth semiconductor material of the second conductivity type is formed in the collector-side.

DETAILED DESCRIPTION

Figure 1:
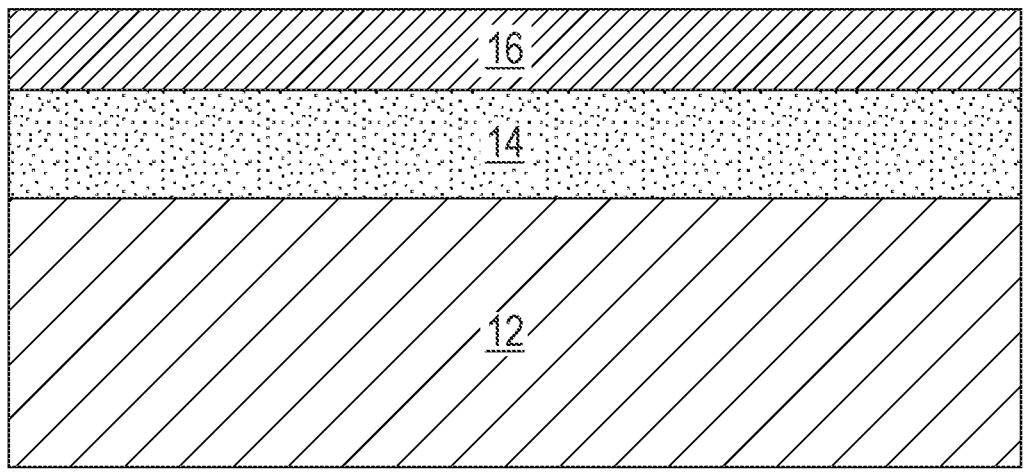
FIG. 1 is a cross sectional view of an exemplary semiconductor structure that can be employed in the present application and including, from bottom to top, a semiconductor substrate, a layer composed of at least a partially insulating material, and a lower intrinsic base layer composed of a first semiconductor material of a first conductivity type.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The present application provides high-performance lateral BJTs (homojunction or heterojunction) in which a lightly doped upper intrinsic base region is formed between a lower intrinsic base region and an extrinsic base region. The lightly doped upper intrinsic base region provides two electron paths which contribute to the collector current, $I_C$. The first electron path is between the lower intrinsic base region and an emitter region and a collector region that are laterally adjacent to, and contacting the lower intrinsic base region. The second electron path is between the lower and upper intrinsic base regions, and the emitter region and collector region that are laterally adjacent to, and in contact with, the lower intrinsic base region. The presence of the lightly doped upper intrinsic base region increases the total $I_C$ and leads to higher current gain, (3, if there is no increase of the base current, $I_B$. The base current, $I_B$, is determined by the hole injection from the base region to the emitter region and is inversely proportional to recombination time in the base region.

Referring now to FIG. 1, there is illustrated an exemplary semiconductor structure that can be employed in the present application. The exemplary structure of FIG. 1 includes, from bottom to top, a semiconductor substrate 12, a layer 14 composed of at least a partially insulating material, and a lower intrinsic base layer 16 composed of a first semiconductor material of a first conductivity type.

The semiconductor substrate 12 is composed of one or more semiconductor materials having semiconducting properties. By "semiconducting properties" it is meant a material whose electrical conductivity is between that of a conductive metal and an insulator. Examples of semiconductor materials that can be used as the semiconductor substrate 12 include, but are not limited to, silicon (Si), a silicon germanium (SiGe) alloy, a silicon germanium carbide (SiGeC) alloy, germanium (Ge), a III/V compound semiconductor, or a II/VI compound semiconductor. The semiconductor substrate 12 typically has an upper semiconductor material that is single-crystalline. The semiconductor substrate 12 can have any of the well-known crystal orientations including, for example, {100}, {110} or {111}.

The semiconductor substrate 12 that is employed in the present application is a bulk semiconductor substrate. The term "bulk semiconductor substrate" denotes a substrate that is composed entirely of one or more semiconductor materials, as defined above.

In one embodiment, the at least partially insulating material that provides layer 14 is composed of an electrical insulator. By "electrical insulator" it is meant a dielectric material whose internal electric charges do not flow freely and very little or no electrical current will flow through it under the influence of an electrical field. Examples of electrical insulators that can be used in the present application include, but are not limited to, silicon dioxide or boron nitride. A single electrical insulator or a multilayered stack of electrical insulators can be used as the at least partially insulating material that provides layer 14.

In another embodiment, the partially insulating material that provides layer 14 is composed of a material that has semi-insulating properties. By "semi-insulating properties" it is meant a wide-band-gap material that has semiconducting and insulating properties. Examples of materials having semi-insulating properties include, but are not limited to, InAlAs or GaAs. A single material having semi-insulating properties or a multilayered stack of materials having semi-insulating properties can be used as the at least partially insulating material that provides layer 14.

In yet another embodiment, the partially insulating material that provides layer 14 can include a multilayered stack of, and in any order, an electrical insulator, as defined above, and a semi-insulating material, as defined above.

Layer 14, which is composed of the at least partially insulating material, is a continuous layer which has a first surface (i.e., the bottommost surface) that forms an interface with a topmost surface of the semiconductor substrate 12, and a second surface (i.e., the topmost surface) that is opposite to the first surface that forms an interface with a bottommost surface of the intrinsic base layer 16. Layer 14, which is composed of the at least partially insulating material, can have a thickness that is from 10 nm to 400 nm; although thicknesses can be used in the present application for the thickness of layer 14.

As mentioned above, the lower intrinsic base layer 16 is composed of a first semiconductor material. The first semiconductor material includes one of the semiconductor materials mentioned above for the semiconductor substrate 12. In one embodiment, the first semiconductor material that provides the lower intrinsic base layer 16 is a compositionally same semiconductor material as the semiconductor substrate 12. By way of an example, the first semiconductor material that provides the lower intrinsic base layer 16 and the semiconductor substrate 12 are both composed of one of silicon, germanium, or a Group III-V compound semiconductor. In another embodiment, the first semiconductor material that provides the lower intrinsic base layer 16 is a compositionally different semiconductor material than the semiconductor substrate 12. By one of an example, the first semiconductor material that provides the lower intrinsic base layer 16 is composed of a III-V compound semiconductor, and the semiconductor substrate 12 is composed of silicon or germanium.

As mentioned above, the first semiconductor material that provides the lower intrinsic base layer 16 is of the first conductivity type. In one embodiment, the first conductivity type is n-type. That is, the first semiconductor material that provides the lower intrinsic base layer 16 includes an n-type dopant present therein. The term "n-type" refers to the addition of impurities that contributes free electrons to an intrinsic semiconductor. In a silicon containing semiconductor material, examples of n-type dopants, i.e., impurities, include, but are not limited to, antimony, arsenic and phosphorous.

In another embodiment, the first conductivity type is p-type. That is, the first semiconductor material that provides the lower intrinsic base layer 16 includes a p-type dopant present therein. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium.

Notwithstanding the type of dopant (n-type or p-type) present in the first semiconductor material that provides the lower intrinsic base layer 16, the lower intrinsic base layer 16 has a dopant concentration from $1\times10^{18}$ atoms/cm$^3$ to $5\times10^{21}$ atoms/cm$^3$, although other dopant concentrations are also conceived for the lower intrinsic base layer 16. The lower intrinsic base layer 16 can have a thickness that is from 25 nm to 500 nm; although thicknesses can be used in the present application for the thickness of the lower intrinsic base layer 16.

The exemplary semiconductor structure shown in FIG. 1 can be formed utilizing conventional techniques that are well-known to those skilled in the art. In one example, the exemplary semiconductor structure shown in FIG. 1 can be formed utilizing a process referred to as SIMOX (i.e., separation by ion implantation of oxygen) in which oxygen ions are implanted into a bulk semiconductor substrate to form a buried oxygen implant region in the bulk semiconductor substrate, and thereafter a high temperature anneal (greater than 550° C.) is used to convert the buried oxygen implant region into a buried oxide.

In another example, the exemplary semiconductor structure shown in FIG. 1 can be formed by bonding two wafers together. For example, wafer bonding can include providing a first wafer that includes the semiconductor substrate 12 and layer 14, and a second wafer that includes the lower intrinsic base layer 16 and a sacrificial, i.e., handle, substrate, bringing the two wafers into intimate contact with each other, heating the contacted wafers at room temperature or above, and then removing the sacrificial, i.e., handle, substrate, from the bonded wafers.

In yet another example, the exemplary semiconductor structure shown in FIG. 1 can be formed by depositing layer 14 composed of the at least partially insulating material on a surface of the semiconductor substrate 12. The depositing can include any conventional deposition process including, but not limited to, chemical vapor deposition (CVD), plasma enhanced chemical vapor deposition (PECVD), atomic layer deposition (ALD), or physical vapor deposition (PVD). Alternatively, and when layer 14 is composed of a semi-insulating material, an epitaxial growth process can be used to deposit layer 14 on the surface of semiconductor substrate 12. Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking. The epitaxial growth of layer 14 can be performed utilizing any well-known precursor gas or gas mixture. Carrier gases like hydrogen, nitrogen, helium and argon can be used.

Following, the deposition of layer 14, the first semiconductor material that provides the lower intrinsic base layer 16 is formed on a physically exposed surface of layer 14 utilizing a deposition process such as, for example, chemical vapor deposition (CVD), plasma enhanced chemical vapor deposition (PECVD), atomic layer deposition (ALD), or physical vapor deposition (PVD). N-type or p-type dopants, as defined above, can then be introduced into the first semiconductor material to provide the lower intrinsic base layer 16. The dopants can be introduced into the first semiconductor material by ion implantation, gas phase doping, plasma doping, plasma immersion ion implantation, cluster doping, infusion doping, liquid phase doping, solid phase doping, and/or any suitable combination of those techniques.

Alternatively, an epitaxial growth process, as mentioned above, can be used to form a layer of the first semiconductor material that provides the lower intrinsic base layer 16. In some embodiments, the n-type dopant or p-type dopant that is present in the first semiconductor material is introduced into the precursor gas or gas mixture. In other embodiments, the n-type dopant or p-type dopant is introduced into the first semiconductor after the epitaxial growth process utilizing one of the techniques mentioned above.

Figure 2:
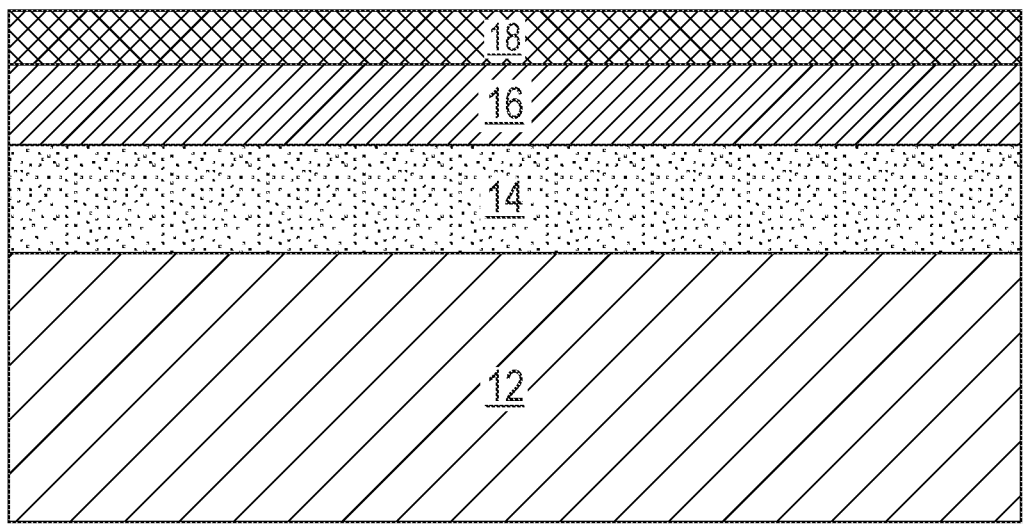
FIG. 2 is a cross sectional view of the exemplary semiconductor structure of FIG. 1 after forming an upper intrinsic base layer composed of a second semiconductor material of the first conductivity type on a surface of the lower intrinsic base layer.

Referring now to FIG. 2, there is illustrated the exemplary semiconductor structure of FIG. 1 after forming an upper intrinsic base layer 18 composed of a second semiconductor material of the first conductivity type on a surface of the lower intrinsic base layer 16. The upper intrinsic base layer 18 is a continuous layer that is located on an entirety of the lower intrinsic base layer 16.

The second semiconductor material that provides the upper intrinsic base layer 18 is composed of one of the semiconductor materials mentioned above for semiconductor substrate 12. In one embodiment, the second semiconductor material that provides the upper intrinsic base layer 18 can be compositionally the same as the first semiconductor material that provides the lower intrinsic base layer 16. In another embodiment, the second semiconductor material that provides the upper intrinsic base layer 18 can be compositionally different from the first semiconductor material that provides the lower intrinsic base layer 16.

The concentration of first conductivity type dopant that is present in the upper intrinsic base layer 18 is less than the dopant concentration of the first conductivity type dopant present in the lower intrinsic base layer 16. In one embodiment, the concentration of first conductivity type dopant that is present in the upper intrinsic base layer 18 is from $1 \times 10^{16}$ atoms/cm$^3$ to $1 \times 10^{18}$ atoms/cm$^3$.

The upper intrinsic base layer 18 is formed utilizing an epitaxial growth process as defined above. The first conductivity type dopant that is present in the upper intrinsic base layer 18 is typically introduced during the epitaxial growth process. The upper intrinsic base layer 18 has a same crystal structure as the lower intrinsic base layer 16. The upper intrinsic base layer 18 can have a thickness from 5 nm to 20 nm. Although thicknesses are however possible for the thickness of the upper intrinsic base layer 18.

Figure 3:
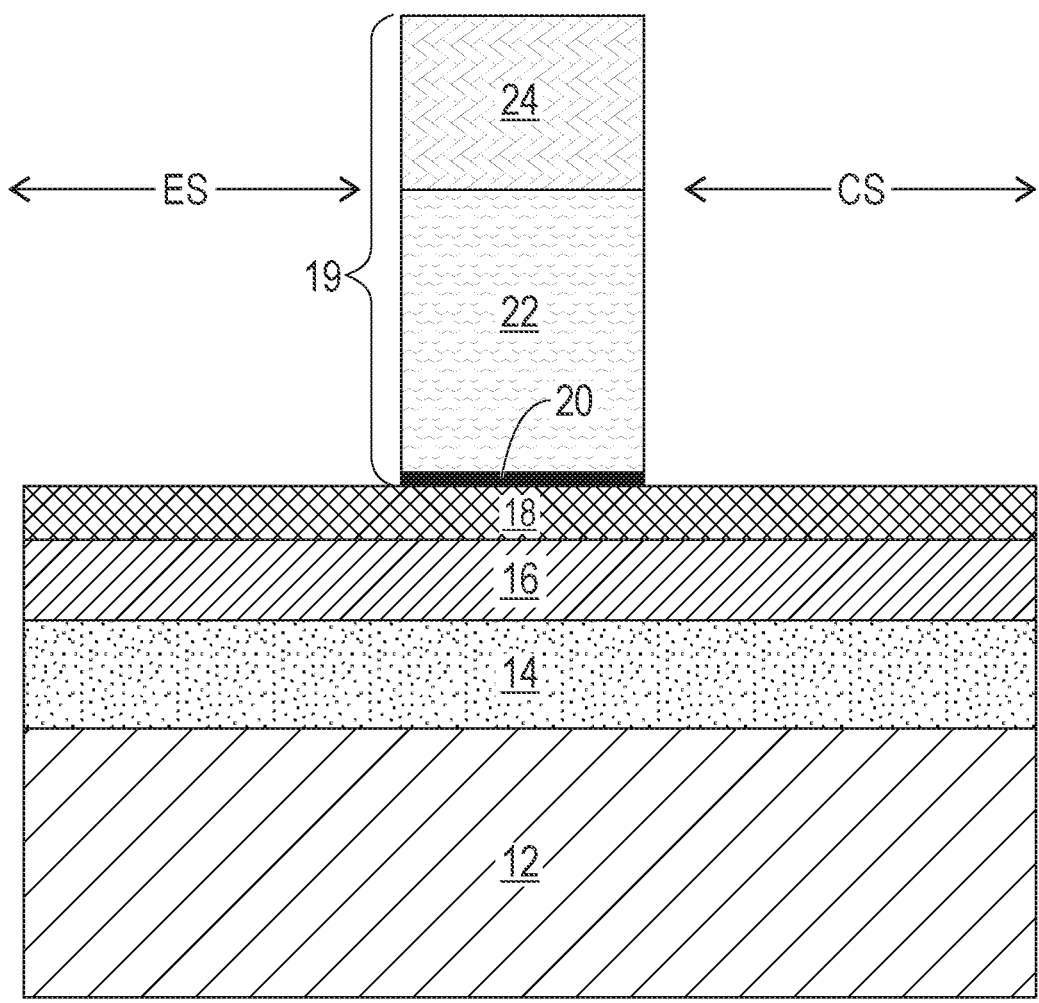
FIG. 3 is a cross sectional view of the exemplary semiconductor structure of FIG. 2 after forming a first patterned material stack on a surface of the upper intrinsic base layer, wherein the first patterned material stack includes a permeable dielectric material, an extrinsic base region composed of a third semiconductor material of the first conductivity type, and a hard mask cap.

Referring now to FIG. 3, there is illustrated the exemplary semiconductor structure of FIG. 2 after forming a first patterned material stack 19 on a surface of the upper intrinsic base layer 18, wherein the first patterned material stack 19 includes a permeable dielectric material 20, an extrinsic base region 22 composed of a third semiconductor material of the first conductivity type, and a hard mask cap 24. In some embodiments, the permeable dielectric material 20 and/or the hard mask cap 24 can be omitted from the first patterned material stack 19. Although a single first patterned material stack 19 is described and illustrated, the present application contemplates embodiments in which a plurality of spaced apart first patterned material stacks is formed on the upper intrinsic base layer 18.

As is shown, an emitter-side, ES, is present on a first side of the first patterned material stack 19, and a collector-side, CS, is present on a second side of the first patterned material stack 19, that is opposite the first side. The emitter-side, ES, is an area in which the emitter region will be subsequently formed, and the collector-side, CS, is the area in which the collector region will be subsequently formed.

When present, the permeable dielectric material 20 is composed of a dielectric material that has a relative permittivity from 2 to 8. As known to those skilled in the art, the permittivity is a measure of how easy or difficult it is to form an electric field inside a medium. Illustrative examples, of dielectric materials that can be used as the permeable dielectric material 20 include, but are not limited to, silicon dioxide. The permeable dielectric material 20 can be formed utilizing any conventional deposition process including, but not limited to, chemical vapor deposition (CVD), plasma enhanced chemical vapor deposition (PECVD), atomic layer deposition (ALD), or physical vapor deposition (PVD). When present, the permeable dielectric material 20 has a thickness from 0.1 nm to 1 nm; although other thicknesses are possible and can be used in the present application as the thickness of the permeable dielectric material 20.

The third semiconductor material that provides the extrinsic base region 22 can include one of the semiconductor materials mentioned above for semiconductor substrate 12. In some embodiments, the third semiconductor material that provides the extrinsic base region 22 can be compositionally the same as the second semiconductor material that provides the upper intrinsic base layer 18. In such an embodiment, the third semiconductor material that provides the extrinsic base region 22 can be compositionally the same as, or compositionally different from, the first semiconductor material that provides the lower intrinsic base layer 16. In other embodiments, the third semiconductor material that provides the extrinsic base region 22 can be compositionally different from the second semiconductor material that provides the upper intrinsic base layer 18. In such an embodiment, the third semiconductor material that provides the extrinsic base region 22 can be compositionally the same as, or compositionally different from, the first semiconductor material that provides the lower intrinsic base layer 16.

In some embodiments, the third semiconductor material that provides the extrinsic base region 22 can be formed utilizing an epitaxial growth process as mentioned above. In such an embodiment, the dopant that provides the first conductivity type to the third semiconductor material that provides the extrinsic base region 22 can be introducing during the epitaxial growth process itself. Alternatively, the dopants can be introduced into the third semiconductor material after formation of the same utilizing, for example, ion implantation, gas phase doping, plasma doping, plasma immersion ion implantation, cluster doping, infusion doping, liquid phase doping, solid phase doping, and/or any suitable combination of those techniques.

In some embodiments, and when the permeable dielectric material 20 is present, the third semiconductor material that provides the extrinsic base region 22 is polycrystalline, e.g., polycrystalline silicon. In other embodiments, and when the permeable dielectric material 20 is omitted, the third semiconductor material that provides the extrinsic base region 22 is single crystalline.

The concentration of first conductivity type dopant that is present in the extrinsic base region 22 is greater than the dopant concentration of the first conductivity type dopant present in the lower intrinsic base layer 16 and the upper intrinsic base layer 18. In one embodiment, the concentration of first conductivity type dopant that is present in the extrinsic base region 22 is from $1 \times 10^{19}$ atoms/cm$^3$ to $5 \times 10^{21}$ atoms/cm$^3$. The extrinsic base region 22 can have a thickness from 50 nm to 500 nm; although other thicknesses may be used as the thickness of the extrinsic base region 22 of the present application.

If present, the hard mask cap 24 of the first patterned material stack 19 can be composed of a dielectric hard mask material such as, for example, silicon dioxide, silicon nitride and/or silicon oxynitride. The hard mask cap 24 can be formed by any suitable deposition process such as, for example, chemical vapor deposition (CVD) or plasma enhanced chemical vapor deposition (PECVD). The hard mask cap 24 can have a thickness from 25 nm to 100 nm; although other thicknesses may be used as the thickness of the hard mask cap 24 of the present application.

The first patterned material stack 19 can be formed by first forming blanket layers of the optional permeable dielectric material 20, the extrinsic base region 22, and the optional hard mask cap 24, and thereafter lithography and etching can be used to pattern the blanket layers and provide the first patterned material stack. Lithography includes forming a photoresist material on a material or material stack that needs to be patterned, exposing the photoresist material to a desired pattern of irradiation, and developing the exposed photoresist material. The etch used to form the patterned material stack 19 can include an anisotropic etch such as, for example, a reactive ion etching or a plasma etch.

Figure 4:
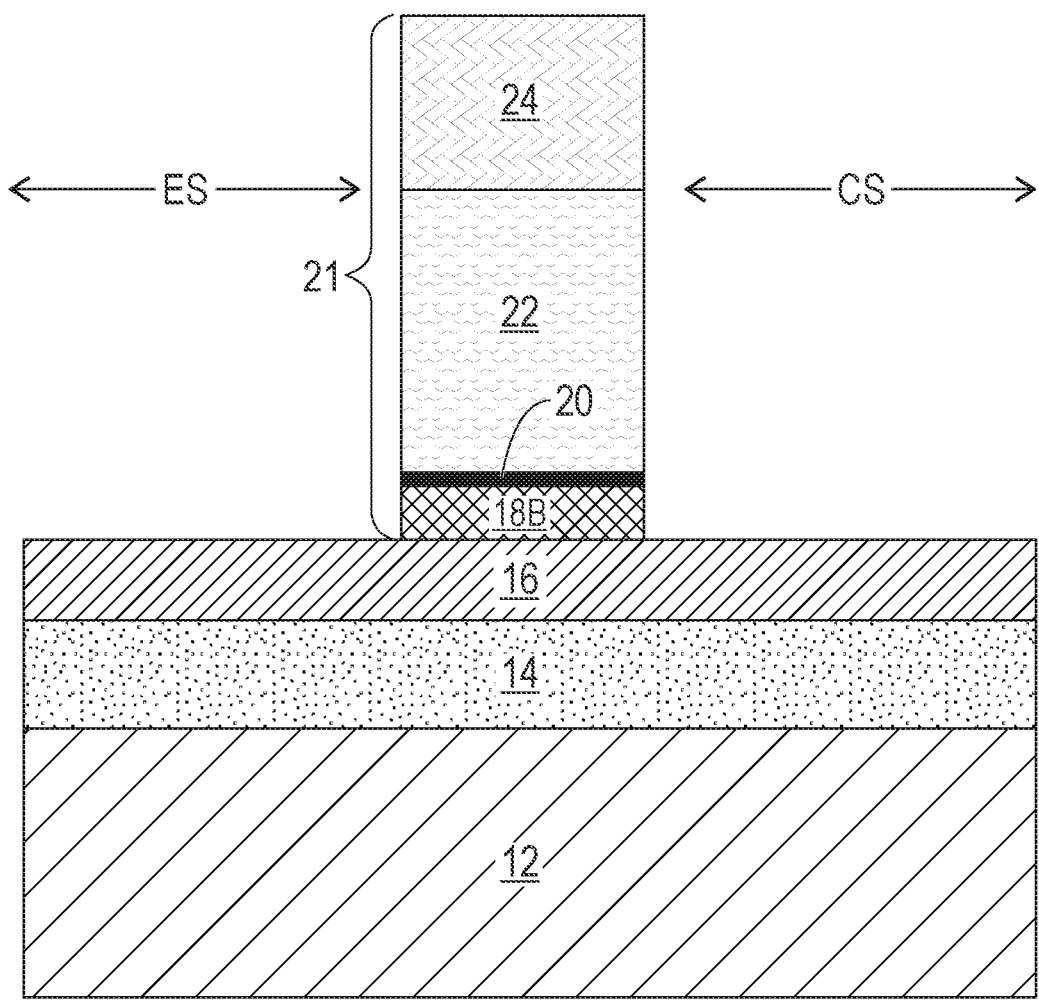
FIG. 4 is a cross sectional view of the exemplary semiconductor structure of FIG. 3 after patterning the upper intrinsic base layer to provide a second patterned material stack utilizing the first patterned material stack as an etch mask, wherein the second patterned material stack includes a remaining portion of the upper intrinsic base layer (hereinafter upper intrinsic base region), the permeable dielectric material, the extrinsic base region, and the hard mask cap.

Referring now to FIG. 4, there is illustrated the exemplary semiconductor structure of FIG. 3 after patterning the upper intrinsic base layer 18 to provide a second patterned material stack 21 utilizing the first patterned material stack 19 as an etch mask. The second patterned material stack 21 includes a remaining portion of the upper intrinsic base layer 18 (hereinafter upper intrinsic base region 18B), the optional permeable dielectric material 20, the extrinsic base region 22, and, if present, the hard mask cap 24. In some embodiments, the permeable dielectric material 20 and/or the hard mask cap 24 is omitted from the second patterned material stack 21. The patterning of the upper intrinsic base layer 18 includes an anisotropic etch such as, for example, a reactive ion etching or a plasma etch.

The upper intrinsic base region 18B is composed of the second semiconductor material of the first conductivity mentioned. The concentration of dopant (p-type or n-type) that is present in the upper intrinsic base region 18B is the same as the concentration mentioned above for the upper intrinsic base layer 18. In the illustrated embodiment of FIG. 4, the upper intrinsic base region 18B has an outermost sidewall that is vertically aligned to an outermost side of each of the permeable dielectric material 20, the extrinsic base region 22, and the hard mask cap 24. The second patterned material stack 21 covers only a portion of the lower intrinsic base layer 16; portions of the lower intrinsic base layer 16 are left uncovered in the emitter-side, ES, and in the collector-side, CS, of the structure.

Figure 5:
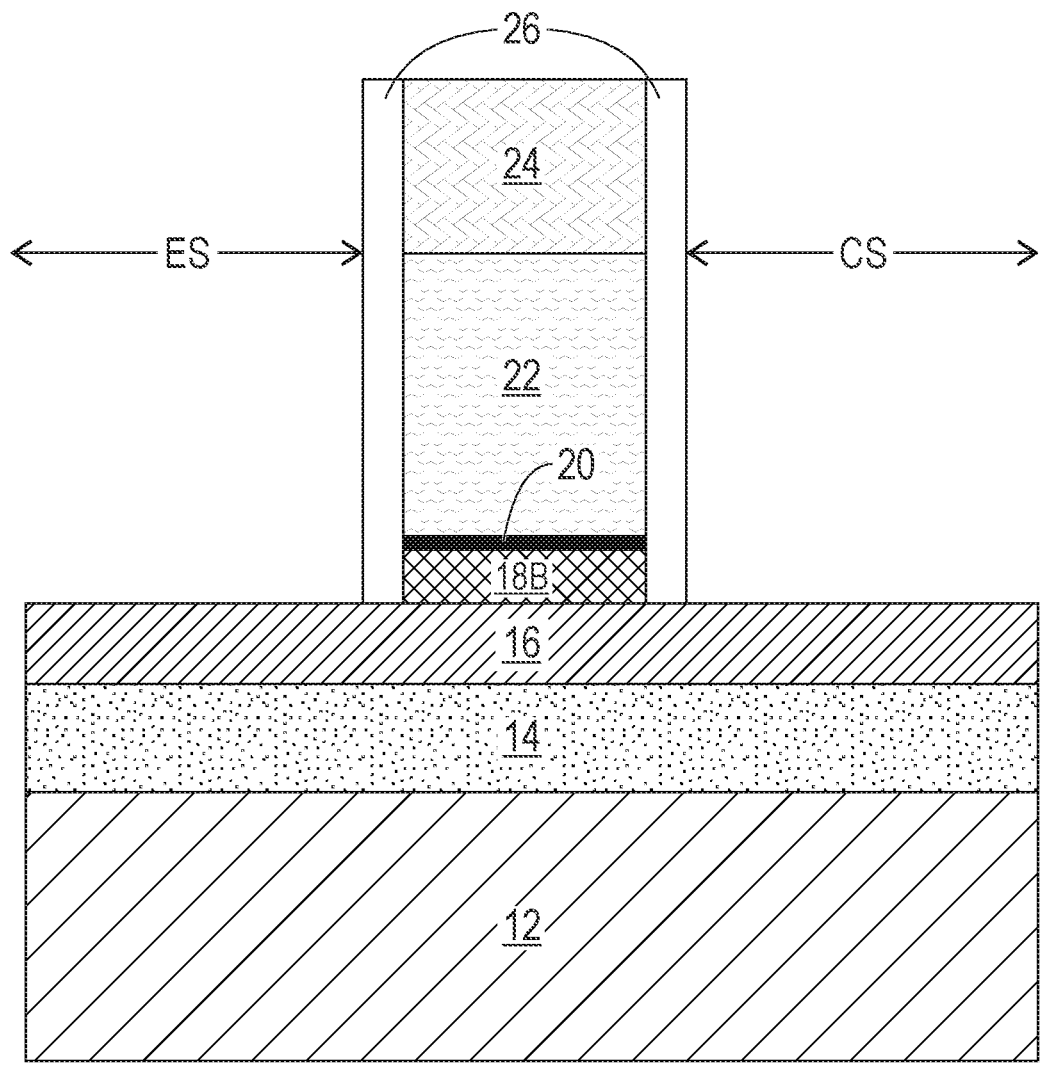
FIG. 5 is a cross sectional view of the exemplary semiconductor structure of FIG. 4 after forming a dielectric spacer along a sidewall of the second patterned material stack and in both an emitter-side and a collector-side of the second patterned material stack.

Referring now to FIG. 5, there is illustrated the exemplary semiconductor structure of FIG. 4 after forming a dielectric spacer 26 along a sidewall of the second patterned material stack 21 in the emitter-side, ES, and in the collector-side, CS, of the structure. The second patterned material stack 21 and the dielectric spacer 26 cover only a portion of the lower intrinsic base layer 16; other portions of the lower intrinsic base layer 16 are left physically exposed. The innermost sidewall of the dielectric spacer 26 contacts each of the elements present in the second patterned material stack 21.

The dielectric spacer 26 is composed of a dielectric spacer material, which is typically compositionally different from the hard mask cap 24. One example of a dielectric spacer material that can be employed in the present application is silicon nitride. The dielectric spacer 26 can be formed by deposition of a first dielectric spacer material, followed by a spacer etch. The deposition of the dielectric spacer material includes, for example, chemical vapor deposition (CVD), plasma enhanced chemical vapor deposition (PECVD), or physical vapor deposition (PVD). The spacer etch can include a reactive ion etch. At this point of the present application, dielectric spacer 26 can have a topmost surface that is coplanar with a topmost surface of the hard mask cap 24. If the hard mask cap 24 is not present, the dielectric spacer 26 can have a topmost surface that is coplanar with a topmost surface of the extrinsic base region 22.

Figure 6:
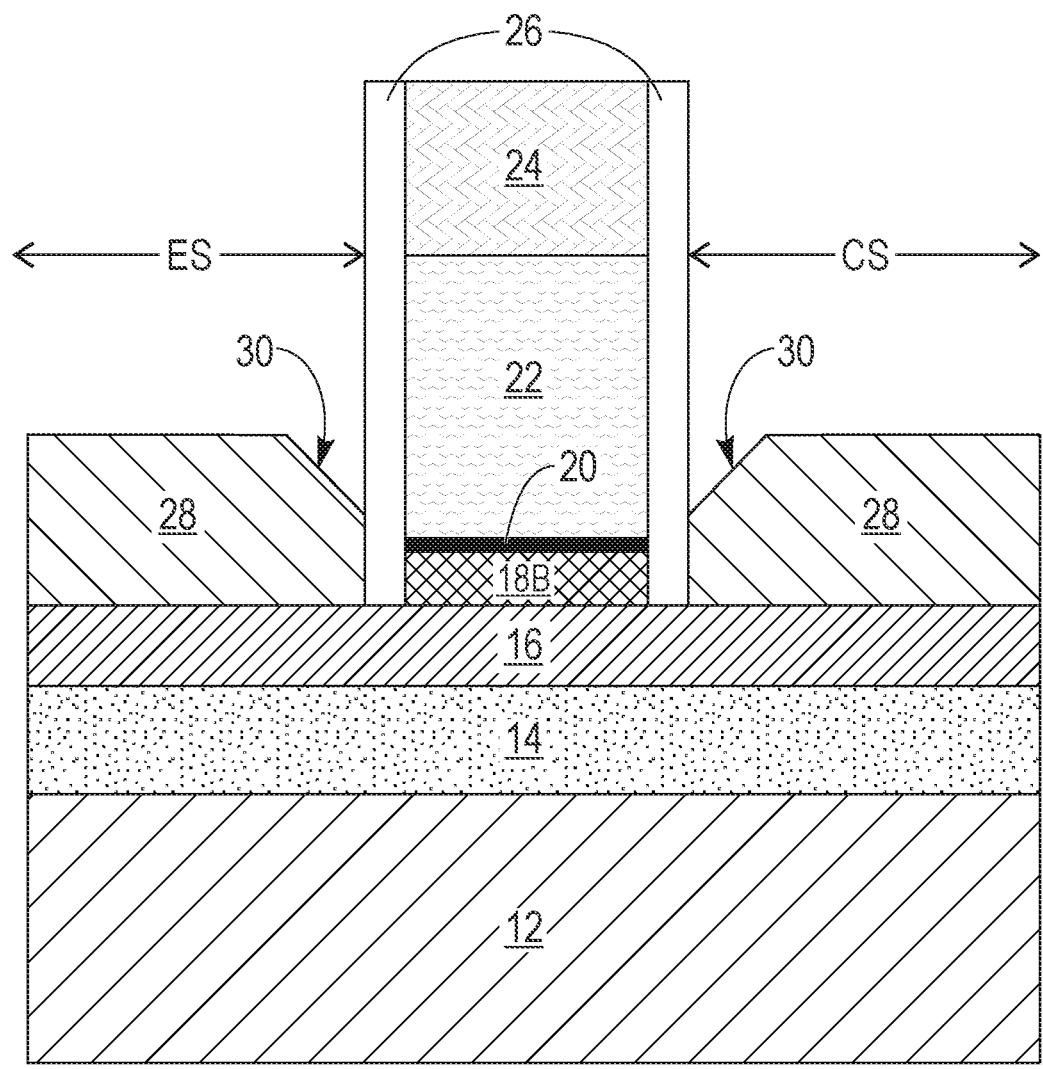
FIG. 6 is a cross sectional view of the exemplary semiconductor structure of FIG. 5 after forming a sacrificial faceted epitaxial semiconductor material in both the emitter-side and the collector-side and on physically exposed portions of the lower intrinsic base layer that are not covered by the dielectric spacer and the second patterned material stack.

Referring now to FIG. 6, there is illustrated the exemplary semiconductor structure of FIG. 5 after forming a sacrificial faceted epitaxial semiconductor material 28 in both the emitter-side, ES, and the collector-side, CS, and on physically exposed portions of the lower intrinsic base layer 16 that are not covered by the dielectric spacer 26 and the second patterned material stack 21. Each sacrificial faceted epitaxial semiconductor material 28 that is formed has a faceted surface 30 that is adjacent an outermost sidewall of dielectric spacer 26.

Each sacrificial faceted epitaxial semiconductor material 28 can include one of the semiconductor materials mentioned above for the semiconductor substrate 12 and must have an etch selectivity that is different from the first semiconductor material that provides the lower intrinsic base layer 16. In one example, each sacrificial faceted epitaxial semiconductor material 28 is composed of germanium.

Each sacrificial faceted epitaxial semiconductor material 28 can be formed utilizing an epitaxial growth process, as defined above. The faceted surface 30 is provided by tuning/selecting epitaxial growth conditions including but not limited to, pressure, temperature and precursor flow rates. Such tuning is well-known to those skilled in the art. In some embodiments, desired {111} crystallographic planes of the semiconductor material that provides each sacrificial faceted epitaxial semiconductor material 28 are grown epitaxially.

Figure 7:
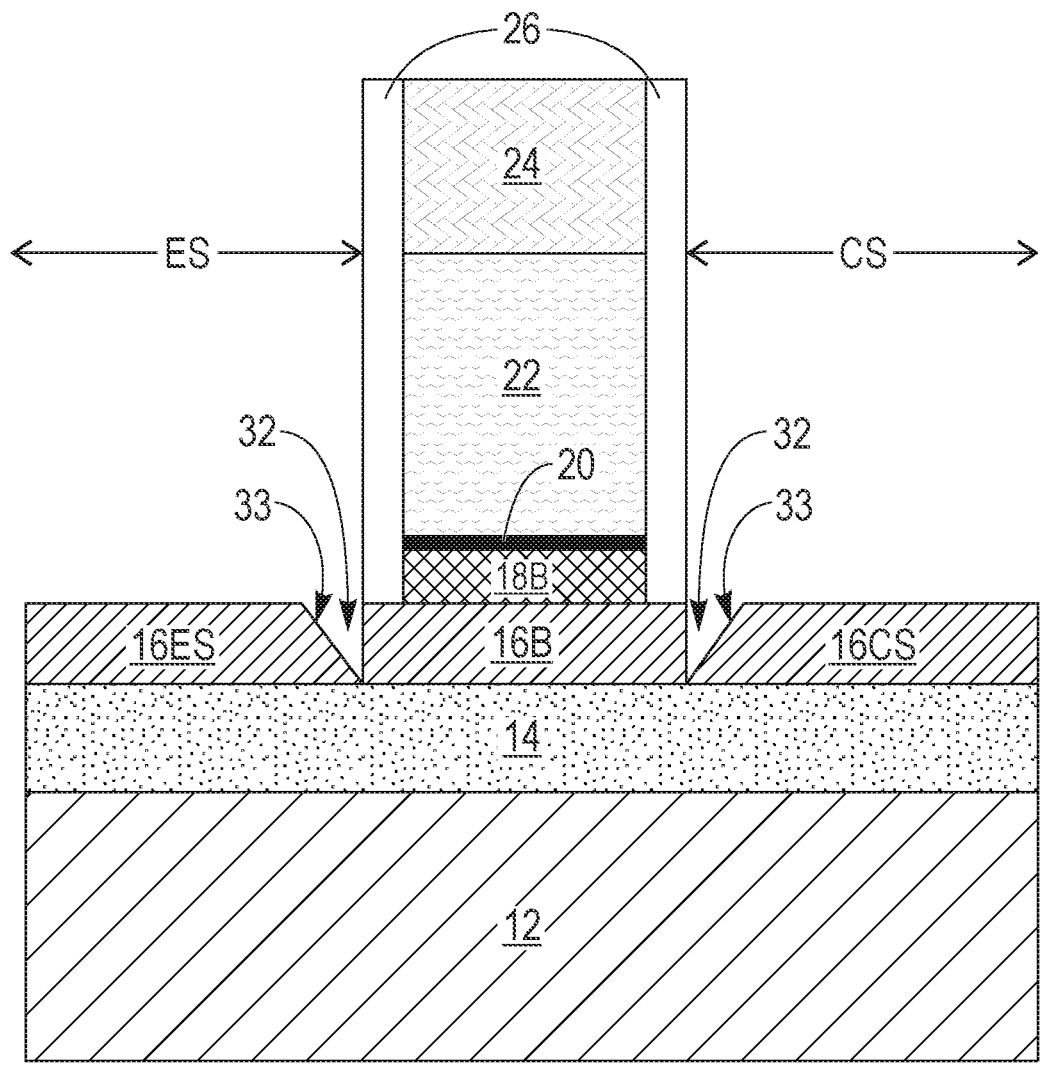
FIG. 7 is a cross sectional view of the exemplary semiconductor structure of FIG. 6 after removing the sacrificial faceted semiconductor material from both the emitter-side and the collector-side of, wherein during the removal of the sacrificial faceted semiconductor material a notch is created into the lower intrinsic base layer that is located in both the emitter-side and the collector-side providing a faceted intrinsic base portion in both the emitter-side and the collector-side.

Referring now to FIG. 7, there is illustrated the exemplary semiconductor structure of FIG. 6 after removing the sacrificial faceted semiconductor material 28 from both the emitter-side, ES, and the collector-side, CS. During the removal of the sacrificial faceted semiconductor material 28 a notch 32 is created into the lower intrinsic base layer 16 that is located in the emitter-side, ES, and the collector-side, CS, which, in turn, provides a faceted intrinsic base portion in both the emitter-side, ES, and the collector-side, CS. The faceted intrinsic base portion in the emitter-side, ES, can be referred to as an emitter-side faceted intrinsic base portion 16ES, while the faceted intrinsic base portion in the collector-side, CS, can be referred to as a collector-side faceted intrinsic base portion 16CS. Notch 32 extends completely through the lower intrinsic base layer 16 that is not covered by the dielectric spacer 26 and the second patterned material stack 21. Notch 32 is in the shape of an inverted triangle in which the tip of the inverted triangle extends down, and exposes a portion of the layer 14 that is located beneath the lower intrinsic base layer 16.

The emitter-side faceted intrinsic base portion 16ES has a faceted surface 33, and the collector-side faceted intrinsic base portion 16CS, also has a faceted surface 33. A portion of the lower intrinsic base layer 16 remains beneath the dielectric spacer 26 and the second patterned material stack 21. This remaining portion of the lower intrinsic base layer 16 that is beneath the dielectric spacer 26 and the second patterned material stack 21 can be referred to as a lower intrinsic base region 16B. At this point of the present application, the lower intrinsic base region 16B has outermost edges that are physically exposed after notch 32 formation.

As is shown, the faceted surface 33 of both the emitter-side faceted intrinsic base portion 16ES and the collector-side faceted intrinsic base portion 16CS extend outwards from a topmost surface to a bottommost surface and is in proximity to the lower intrinsic base region 16B.

Each of the emitter-side faceted intrinsic base portion 16ES, the collector-side faceted intrinsic base portion 16CS, and the lower intrinsic base region 16B is composed of the first semiconductor material of the first conductivity type. Each of the emitter-side faceted intrinsic base portion 16ES, the collector-side faceted intrinsic base portion 16CS, and the lower intrinsic base region 16B has a same dopant concentration as mentioned above for the lower intrinsic base layer 16.

The removal of the sacrificial faceted semiconductor material 28 from both the emitter-side, ES, and the collector-side, CS, and the subsequent formation of the notch 32 can be performed utilizing any dry etching process including, for example, reactive ion etching. The etching process is a partial etch and does not completely remove the lower intrinsic base layer 16 that is not protected by dielectric spacer 26 and the second patterned material stack 21.

In some embodiments (not shown), a junction can now be formed into outermost edges of the lower intrinsic base region 16B that is present beneath the dielectric spacer 26 and the second patterned material stack 21, and into an upper portion of the physically exposed surfaces of the faceted intrinsic base portion (16ES, 16CS) present in both the emitter-side, ES, and the collector-side, CS. In some embodiments, junction formation can be omitted. After forming the junction into outermost edges the lower intrinsic base region 16B, a portion of the lower intrinsic base region 16B remains. In such an embodiment, the lower intrinsic base region 16B has a width that is less than a width of the second patterned material stack 21. In one embodiment, the width of the lower intrinsic base region 16B is from 1 nm to 5 nm.

The junctions are formed by utilizing an angled ion implantation process in which a second conductivity type dopant, opposite to the first conductivity type dopant, is implanted into the outermost edges of the lower intrinsic base region 16B that is present beneath the dielectric spacer 26 and the second patterned material stack 21, and into the upper portion of the physically exposed surfaces of the faceted intrinsic base portion (16ES, 16CS) present in both the emitter-side, ES, and the collector-side, CS. In one embodiment, and when the first conductivity type is n-type, a p-type dopant, as defined above, can be implanted during this step of the present application. Alternatively, and in another embodiment, and when the first conductivity type is p-type, an n-type dopant, as defined above, can be implanted during this step of the present application. A thermal anneal such as laser annealing, flash annealing, rapid thermal annealing (RTA) or any suitable combination of those techniques follows the angled ion implantation process.

Notably, a first emitter-side junction (not shown) composed of the first semiconductor material of the second conductivity type is formed in a first outermost edge of the lower intrinsic base region 16B, and a first collector-side junction (not shown) composed of the first semiconductor material of the second conductivity type is formed in a second outermost edge, opposite the first outermost edge, of the lower intrinsic base region 16B. The concentration of second conductivity type dopant that is present in the first emitter-side junction and the first collector-side junction is from $1 \times 10^{19}$ atoms/cm$^3$ to $5 \times 10^{21}$ atoms/cm$^3$. The first emitter-side junction and the first collector-side junction are located beneath the dielectric spacer 26 and an outermost portion of the second patterned material stack 21. The first emitter-side junction and the first collector-side junction are vertically orientated, and have a width of about 10 nm (the term "about" denotes that a value may vary between ±10% of a given value).

Also, a second emitter-side junction (not shown) composed of the first semiconductor material of the second conductivity type is formed in the upper portion of the physically exposed emitter-side faceted intrinsic base portion 16ES, and a second collector-side junction (not shown) composed of the first semiconductor material of the second conductivity type is formed in the upper portion of the physically exposed collector-side faceted intrinsic base portion 16CS. The second emitter-side junction and the second collector-side junction have a faceted surface. The concentration of second conductivity type dopant that is present in the second emitter-side junction and the second collector-side junction is from $1 \times 10^{19}$ atoms/cm$^3$ to $5 \times 10^{21}$ atoms/cm$^3$. The notch 32 is still present in the emitter-side, ES, and the collector-side, CS.

Figure 8:
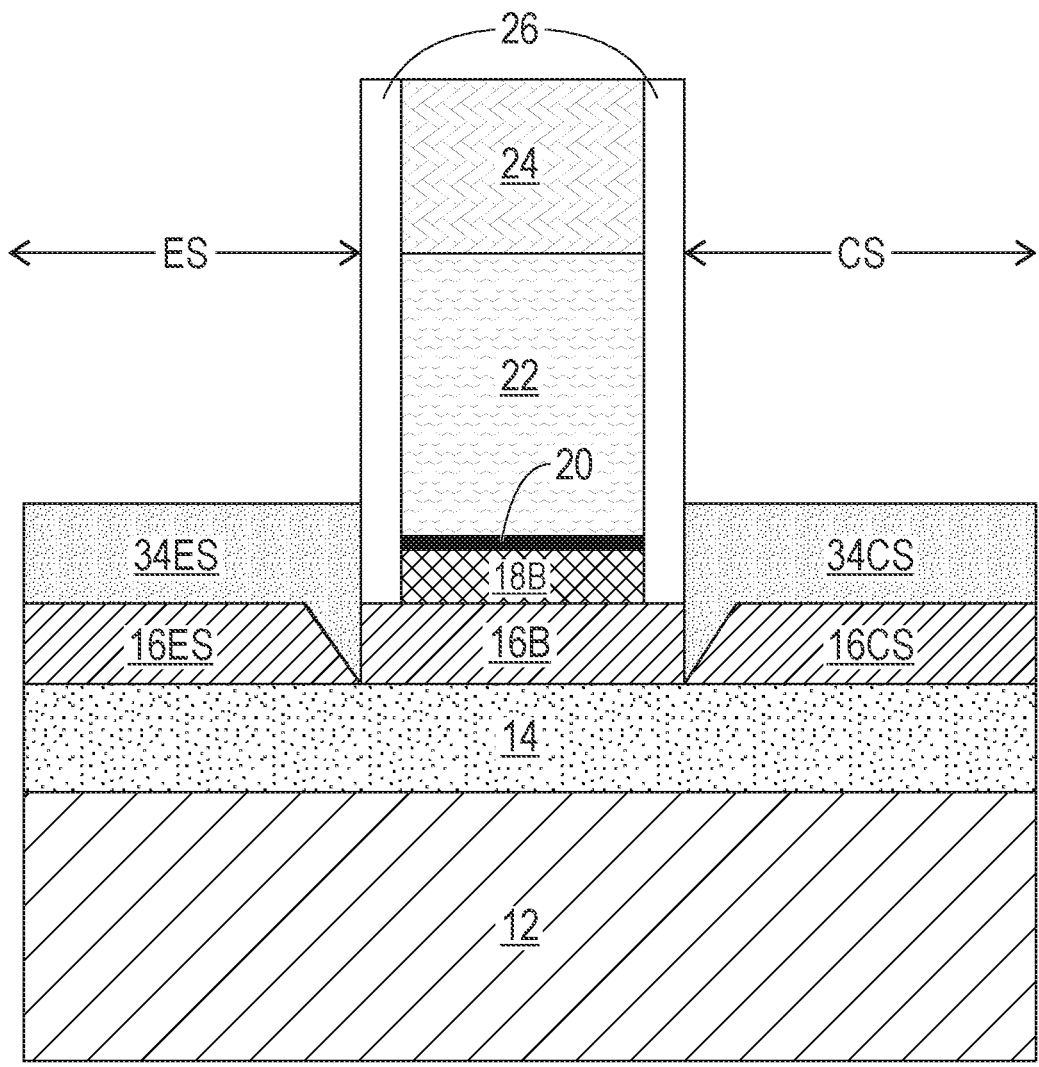
FIG. 8 is a cross sectional view of the exemplary semiconductor structure of FIG. 7 after forming an emitter region composed of a fourth semiconductor material of a second conductivity type that is opposite the first conductivity type in the emitter-side and a collector region composed of the fourth semiconductor material of the second conductivity type in the collector-side.

Referring now to FIG. 8, there is illustrated the exemplary semiconductor structure of FIG. 7 after forming an emitter region 34ES composed of a fourth semiconductor material of the second conductivity type that is opposite the first conductivity type in the emitter-side, ES, and a collector region 34CS composed of the fourth semiconductor material of the second conductivity type in the collector-side, CS.

In some embodiments (not shown), the emitter region 34ES is formed on the second emitter-side junction and fills in the notch 32 present in the emitter-side, ES, and the collector region 34CS is formed on the second collector-side junction and fills in the notch 32 present in the collector-side, CS. In this embodiment, the emitter region 34ES contacts the lower intrinsic base region 16B through the first emitter-side junction, and the collector region 34CS contacts the lower intrinsic base region 16B through the first collector-side junction. In other embodiments as shown in FIG. 8, the emitter region 34ES is formed on the emitter-side faceted intrinsic base portion 16ES and fills in the notch 32 present in the emitter-side, ES, and the collector region 34CS is formed on the collector-side faceted intrinsic base portion 16CS and fills in the notch 32 present in the collector-side, CS. In this embodiment, the emitter region 34ES directly contacts the lower intrinsic base region 16B, and the collector region 34CS, directly contacts the lower intrinsic base region 16B.

The fourth semiconductor material that provides the emitter region 34ES and the collector region 34CS is composed of one of the semiconductor materials mentioned above for semiconductor substrate 12. In one embodiment, the fourth semiconductor material that provides the emitter region 34ES and the collector region 34CS can be compositionally the same as the first semiconductor material that provides the lower intrinsic base layer 16. In such an embodiment, the fourth semiconductor material can be compositionally the same as, or compositionally different from the second semiconductor material and/or the third semiconductor material. In another embodiment, the fourth semiconductor material that provides the emitter region 34ES and the collector region 34CS can be compositionally different from the first semiconductor material that provides the lower intrinsic base layer 16. In such an embodiment, the fourth semiconductor material can be compositionally the same as, or compositionally different from the second semiconductor material and/or the third semiconductor material. The concentration of second conductivity type dopant that is present in the emitter region 34ES and the collector region 34CS is from $1 \times 10^{19}$ atoms/cm$^3$ to $5 \times 10^{21}$ atoms/cm$^3$.

The emitter region 34ES and the collector region 34CS can be formed utilizing an epitaxial growth process as mentioned above. The second conductivity type dopant that is present in the emitter region 34ES and the collector region 34CS is typically introduced during the epitaxial growth process.

Figure 9:
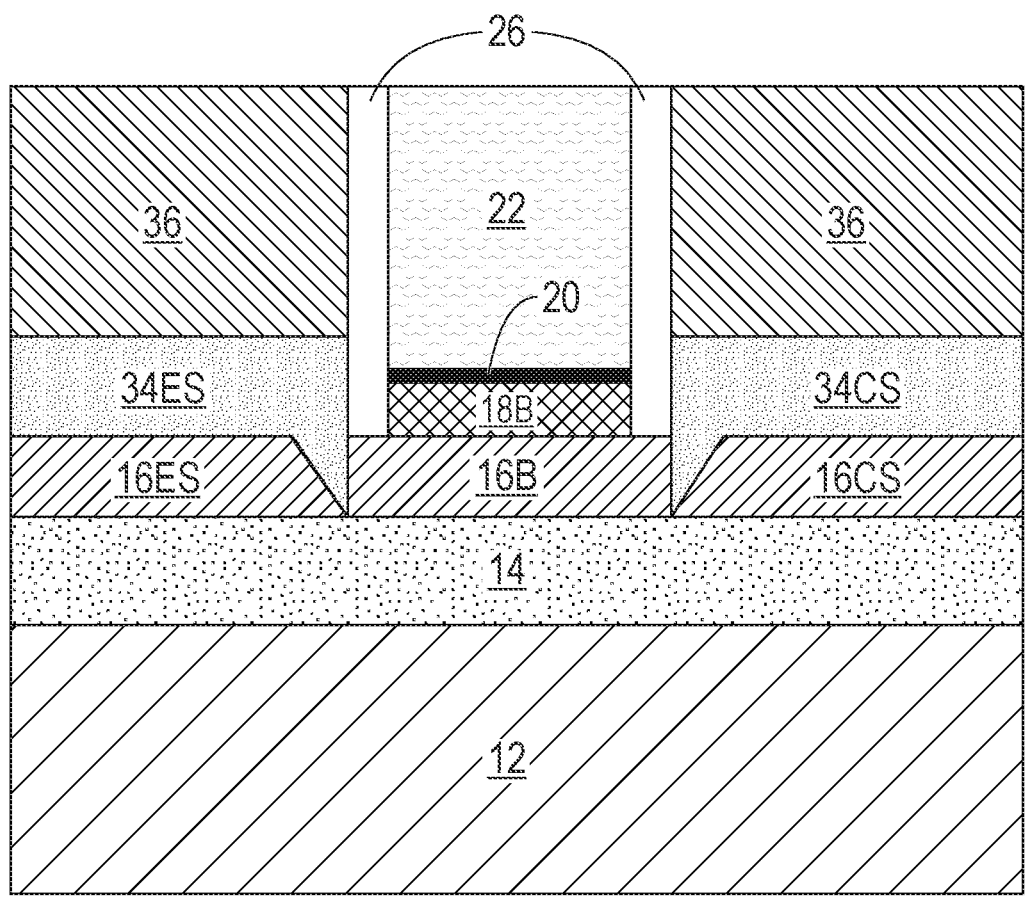
FIG. 9 is a cross sectional view of the exemplary semiconductor structure of FIG. 8 after forming a lower interlayer dielectric (ILD) material on the emitter region and the collector region, and removing the hard mask cap and an upper portion of the dielectric spacer.

Referring now to FIG. 9, there is illustrated the exemplary semiconductor structure of FIG. 8 after forming a lower interlayer dielectric (ILD) material 36 on the emitter region 34ES and the collector region 34CS, and after removing the hard mask cap 24 and an upper portion of the dielectric spacer 26. As is shown, the lower ILD material 36 has a topmost surface that is coplanar with a topmost surface of the remaining portion of the dielectric spacer 26 and the extrinsic base region 22. Removal of hard mask cap 24 and the upper portion of the dielectric spacer 26 is omitted when no hard mask cap 24 is present.

The lower ILD material 36 is composed of a dielectric material that is compositionally different from the dielectric material of the dielectric spacer 26 and the hard mask cap 24. Examples of dielectric materials that can be used as the lower ILD material 36 include silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide.

In one embodiment, the dielectric material that provides the lower ILD material 36 can be formed by a deposition process such as, for example, chemical vapor deposition (CVD), plasma enhanced chemical vapor deposition (PECVD), evaporation or spin-on coating. Following the deposition of the dielectric material that provides the lower ILD material 36, a planarization process such as, for example, chemical mechanical polishing (CMP) and/or grinding, is typically employed. The planarization process stops of the topmost surface of the extrinsic base region 22. Thus, an upper portion of the dielectric spacer 26 and the hard mask cap 24 are removed during the planarization step that provides the lower ILD material 36.

Figure 10:
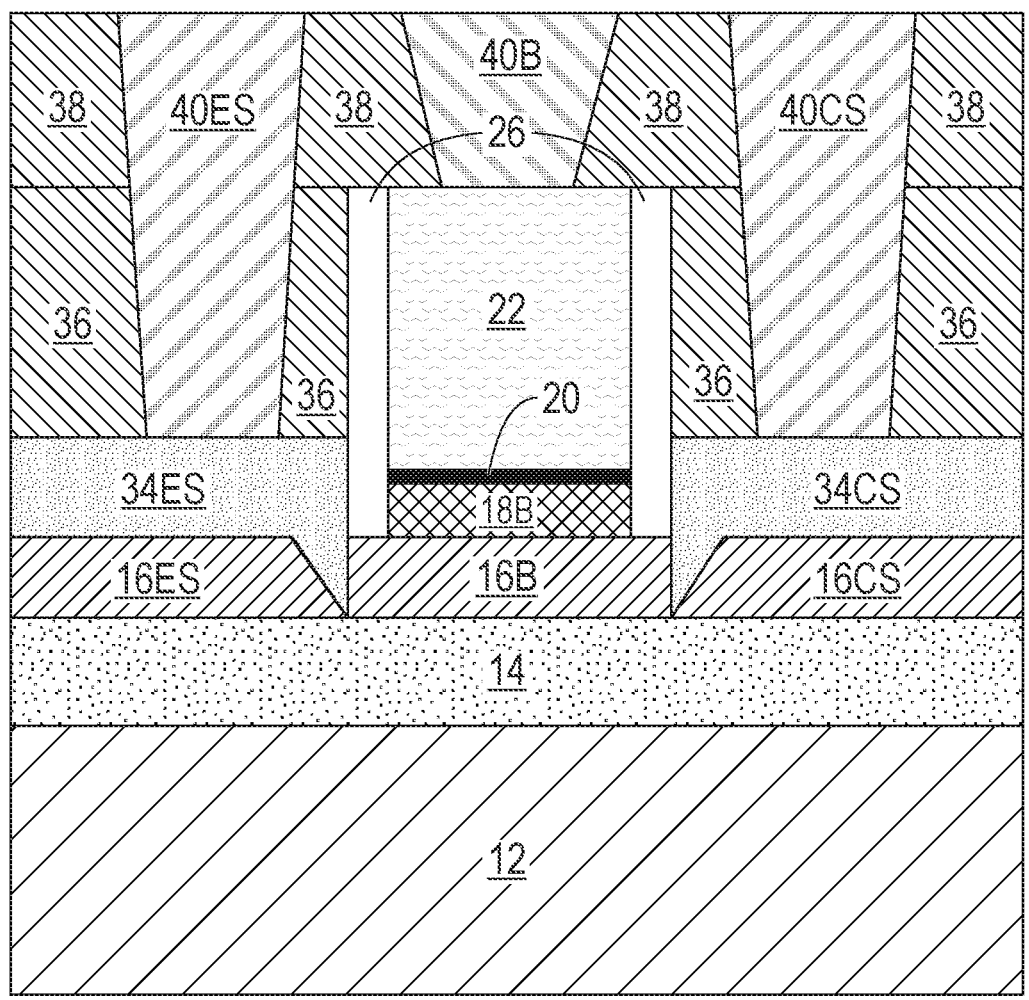
FIG. 10 is a cross sectional view of the exemplary semiconductor structure of FIG. 9 after forming an upper ILD material, and forming a first metal contact structure in the upper and lower ILD materials present in the emitter-side, a second metal contact structure in the upper and lower ILD materials present in the collector-side, and a third metal contact structure in the upper ILD material and above the extrinsic base region.

Referring now to FIG. 10, there is illustrated the exemplary semiconductor structure of FIG. 9 after forming an upper ILD material 38, and forming a first metal contact structure (i.e., an emitter-side contact structure 40ES) in the upper and lower ILD materials (38, 36) present in the emitter-side, ES, a second metal contact structure (i.e., collector-contact structure 40CS) in the upper and lower ILD materials (38, 36) present in the collector-side, CS, and a third metal contact structure (i.e., the base contact structure 40B) in the upper ILD material 38 and above the extrinsic base region 22.

The upper ILD material 38 may include one of the dielectric materials mentioned above for the lower ILD material 36. In some embodiments, the upper ILD material 38 is composed of a compositionally same dielectric material as the lower ILD material 36. In other embodiments, the upper ILD material 38 is composed of a compositionally different dielectric material than the lower ILD material 36. The upper ILD material 38 can be formed by a deposition process such as, for example, chemical vapor deposition (CVD), plasma enhanced chemical vapor deposition (PECVD), evaporation or spin-on coating. Collectively, the lower and upper ILD materials (36, 38) may be referred to as a contact level ILD material.

The emitter-side contact structure 40ES and the collector-side contact structure 40CS can be formed by first providing an emitter/collector contact opening in the upper and lower ILD materials 38, 36. The emitter/collector contact openings can be formed by lithography, as defined above, and etching. The etch used to form the emitter/collector contact openings can include a dry etching process or a chemical wet etching process. The emitter/collector contact openings can have vertical sidewalls or they can have tapered sidewalls. Each emitter/collector contact opening is then filled with a contact metal or contact metal alloy. Examples of contact metals include, but are not limited to, tungsten (W), aluminum (Al), copper (Cu), or cobalt (Co). An example of a contact metal alloy is Cu—Al alloy. The filling of each emitter collector opening includes at least depositing a contact metal or a contact metal alloy within each emitter/collector contact opening. The depositing of the contact metal or contact metal alloy can include, but is not limited to, chemical vapor deposition (CVD), plasma enhanced chemical vapor deposition (PECVD), atomic layer deposition (ALD), sputtering, or plating. A planarization process such as, for example, chemical mechanical polishing, can follow the deposition of the contact metal or metal alloy. In some embodiments (not shown), a diffusion barrier material such as for example, at least one of Ti, Ta, TiN or TaN is formed each of the emitter/collector contact openings prior to forming the contact metal or metal alloy.

The base contact structure 40B can be formed at the same time as the emitter-side contact structure 40ES and the collector-side contact structure 40CS, or either before or after the formation of the emitter-side contact structure 40ES, and the collector-side contact structure 40CS. The base contact structure 40B can be formed by first providing a base contact opening in the upper ILD material 38. The base contact opening is then filled with one of the contact metals or metal alloys mentioned above utilizing a deposition process as mentioned above for forming the contact metal or metal alloy in each of the emitter/collector contact openings. A planarization process such as, for example, chemical mechanical polishing, can follow the deposition of the contact metal or metal alloy. In some embodiments (not shown), a diffusion barrier material such as for example, at least one of Ti, Ta, TiN or TaN is formed into the base contact opening prior to forming the contact metal or metal alloy. The base contact structure 40B can be formed at a same plane as, or a different plane than, the emitter-side contact structure 40ES and the collector-side contact structure 40CS.

The emitter-side contact structure 40ES contacts a surface of the emitter region 34ES, the collector-side contact structure 40CS contacts a surface of the collector region 34CS, and the base contact structure 40B contacts a surface of the extrinsic base region 22. The emitter-side contact structure 40ES has a topmost surface that is coplanar with a topmost surface of the collector-side contact structure 40CS and with a topmost surface of the base contact structure 40B, and the topmost surfaces of both contact structures (40ES, 40CS) and the base contact structure 40B are coplanar with the upper ILD material 38.

Notably, the exemplary semiconductor structure of FIG. 10 illustrates a lateral BJT in accordance with an embodiment of the present application. The lateral BJT shown in FIG. 10 includes lower intrinsic base region 16B composed of the first semiconductor material of the first conductivity type that is located on a surface of layer 14 that is composed of that at least partially insulating material. Upper intrinsic base region 18B composed of the second semiconductor material of the first conductivity type is located on the lower intrinsic base region 16B. The upper intrinsic base region 18B has a lower dopant concentration than the lower intrinsic base region 16B. Extrinsic base region 22 composed of the third semiconductor material of the first conductivity type is located on the upper intrinsic base region 18B. The extrinsic base region 22 has a higher dopant concentration than both the upper and lower intrinsic base regions (18B, 16B). Emitter region 34ES composed of the fourth semiconductor material of the second conductivity type, opposite the first conductivity type, is located laterally adjacent to, and contacting, a first side of the lower intrinsic base region 16B, and collector region 34CS composed of the fourth semiconductor material of the second conductivity is located laterally adjacent to, and contacting, a second side of the lower intrinsic base region 16B, which is opposite the first side of the lower intrinsic base region 16B. In some embodiments, a permeable dielectric material 20 is located between the extrinsic base region 22 and the upper intrinsic base region 18B.

In one embodiment, the lateral BJT of the present application may be PNP lateral BJT in which the first conductivity type is n-type and the second conductivity type is p-type. In another embodiment, the lateral BJT of the present application may be NPN lateral BJT in which the first conductivity type is p-type and the second conductivity type is n-type.

In some embodiments of the present application, the first, second, third and fourth semiconductor materials of the lateral BJT are compositionally the same. In another embodiment, the first semiconductor material is compositionally different from at least the second semiconductor material. In such an embodiment, the first semiconductor material can be compositionally the same as the third semiconductor material, but compositionally different from the fourth semiconductor material, or the first semiconductor material can be compositionally different from the third and fourth semiconductor materials.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A lateral bipolar junction transistor (BJT) comprising:
   a lower intrinsic base region composed of a first semiconductor material of a first conductivity type located on a surface of a layer that is composed of at least a partially insulating material;
   an upper intrinsic base region composed of a second semiconductor material of the first conductivity type located on the lower intrinsic base region, wherein the upper intrinsic base region has a lower dopant concentration than the lower intrinsic base region;
   an extrinsic base region composed of a third semiconductor material of the first conductivity type located on the upper intrinsic base region, wherein the extrinsic base region has a higher dopant concentration than both the upper and lower intrinsic base regions;
   an emitter region composed of a fourth semiconductor material of a second conductivity type, opposite the first conductivity type, located laterally adjacent to, and contacting, a first side of the lower intrinsic base region; and
   a collector region composed of the fourth semiconductor material of the second conductivity located laterally adjacent to, and contacting, a second side of the lower intrinsic base region, which is opposite the first side of the lower intrinsic base region.

2. The lateral BJT of claim 1, further comprising a dielectric spacer located on outermost sidewalls of each of the upper intrinsic base region, and the extrinsic base region, wherein the dielectric spacer has a topmost surface that is coplanar with a topmost surface of the extrinsic base region.

3. The lateral BJT of claim 2, further comprising a permeable dielectric material located between the upper intrinsic base region and the extrinsic base region, wherein the permeable dielectric material contacts an inner sidewall of the dielectric spacer.

4. The lateral BJT of claim 1, further comprising an emitter-side faceted intrinsic base portion composed of the first semiconductor material of the first conductivity type located beneath the emitter region and on the layer that is composed of the at least partially insulating material, and a collector-side faceted intrinsic base portion composed of the first semiconductor material of the first conductivity type located beneath the collector region and on the layer that is composed of the at least partially insulating material.

5. The lateral BJT of claim 4, wherein the emitter-side faceted intrinsic base portion and the collector-side faceted intrinsic base portion have a faceted surface and are spaced apart from the lower intrinsic base region.

6. The lateral BJT of claim 1, wherein the first conductivity type is n-type and the second conductivity type is p-type.

7. The lateral BJT of claim 1, wherein the first conductivity type is p-type and the second conductivity type is n-type.

8. The lateral BJT of claim 1, wherein the first, second, third and fourth semiconductor materials are compositionally the same.

9. The lateral BJT of claim 1, wherein the first semiconductor material is compositionally different from at least the second semiconductor material.

10. The lateral BJT of claim 9, wherein the first semiconductor material is compositionally the same as the third semiconductor material, but compositionally different from the fourth semiconductor material.

11. The lateral BJT of claim 9, wherein the first semiconductor material is compositionally different from the third and fourth semiconductor materials.

12. The lateral BJT of claim 1, wherein the extrinsic base region is in direct physical contact with the upper intrinsic base region and the third semiconductor material that provides the extrinsic base region is single crystalline.

13. The lateral BJT of claim 3, wherein the third semiconductor material that provides the extrinsic base region is polycrystalline crystalline.

14. The lateral BJT of claim 2, further comprising a contact level interlayer dielectric (ILD) material located laterally on the emitter region, the collector region and the extrinsic base region.

15. The lateral BJT of claim 14, further comprising an emitter-side contact structure located in the contact level ILD material and contacting a surface of the emitter region, a collector-side contact structure located in the contact level ILD material and contacting a surface of the collector region, and a base contact structure located in the contact level ILD material and contacting a surface of the extrinsic base region.

* * * * *